United States Patent [19]
Komatsu

[11] Patent Number: 5,223,836
[45] Date of Patent: Jun. 29, 1993

[54] SUBRANGING ANALOG-TO-DIGITAL CONVERTER WITH PRIORITY WEIGHTED CORRECTION FOR THE M.S.B. GROUP

[75] Inventor: Yoshihiro Komatsu, Kanagawa, Japan

[73] Assignee: Sony Corporation, Tokyo, Japan

[21] Appl. No.: 835,359

[22] Filed: Feb. 14, 1992

[30] Foreign Application Priority Data

Feb. 22, 1991 [JP] Japan .................................. 3-050517

[51] Int. Cl.⁵ .............................................. H03M 1/14
[52] U.S. Cl. .................................................. 341/156
[58] Field of Search .................. 341/156, 94, 158, 155

[56] References Cited

U.S. PATENT DOCUMENTS

| | | | |
|---|---|---|---|
| 4,903,028 | 2/1990 | Fukushima | 341/156 |
| 4,939,517 | 7/1990 | Baltus et al. | 341/156 |
| 5,083,126 | 1/1992 | Komatsu et al. | 341/156 |
| 5,099,240 | 3/1992 | Nakatani et al. | 341/156 |

FOREIGN PATENT DOCUMENTS

56-23026 3/1981 Japan .
2-137420 5/1990 Japan .

*Primary Examiner*—Howard L. Williams
*Attorney, Agent, or Firm*—Ronald P. Kananen

[57] ABSTRACT

In an analog/digital conversion circuit, selection signals XA, XB and XC inputted from a lower order comparing circuit unit 5 are assigned priority by weighting the same, in a selection signal weighting circuit 11. When a plurality of the selection signals XA, XB and XC are raised up to an "H", in that, (XA, XB, XC), (XA, XB), (XA, XC) or (XB, XC), line signals SC, SB, and corresponding to weighted selection signals having a higher priority XBO, and XAO are outputted as a higher order conversion code data D1. Thereby a more reliable signal is outputted as the higher order conversion code even if an erroneous operation is caused in the lower order comparing circuit unit 5 and the accuracy of the analog/digital conversion circuit is further enhanced in comparison with the conventional ones.

4 Claims, 8 Drawing Sheets

|  | SA | SB | SC |
|---|---|---|---|
| AU1 | 0 | 1 | 1 |
| AU2 | 1 | 1 | 0 |
| AU3 | 1 | 0 | 0 |
| AU4 | 0 | 0 | 0 |

FIG. 9

| XA | XB | XC | XA0 | XB0 | XC0 | MAX |
|---|---|---|---|---|---|---|
| H | H | H | -400 | -200 | 0 | XC0 |
| L | H | H | -800 | -200 | 0 | XC0 |
| H | L | H | -400 | -800 | 0 | XC0 |
| L | L | H | -800 | -800 | 0 | XC0 |
| H | H | L | -400 | -200 | -600 | XB0 |
| L | H | L | -800 | -200 | -600 | XB0 |
| H | L | L | -400 | -800 | -600 | XA0 |
| L | L | L | -800 | -800 | -600 | XC0 |

SUBRANGING ANALOG-TO-DIGITAL CONVERTER WITH PRIORITY WEIGHTED CORRECTION FOR THE M.S.B. GROUP

BACKGROUND OF THE INVENTION

This invention relates to an analog/digital conversion circuit, and more particularly to an improvement of a series parallel type analog/digital conversion circuit which,, converts analog signals into digital signals while separating the same into high order and low order signals.

A conventional analog/digital conversion circuit (hereinbelow called as an A/D conversion circuit) which converts analog signals such as video signals into digital data, for example, an A/D conversion circuit called a two step series parallel type, is proposed in Japanese Patent Application Laid Open Number 2-137420.

Figure 1:
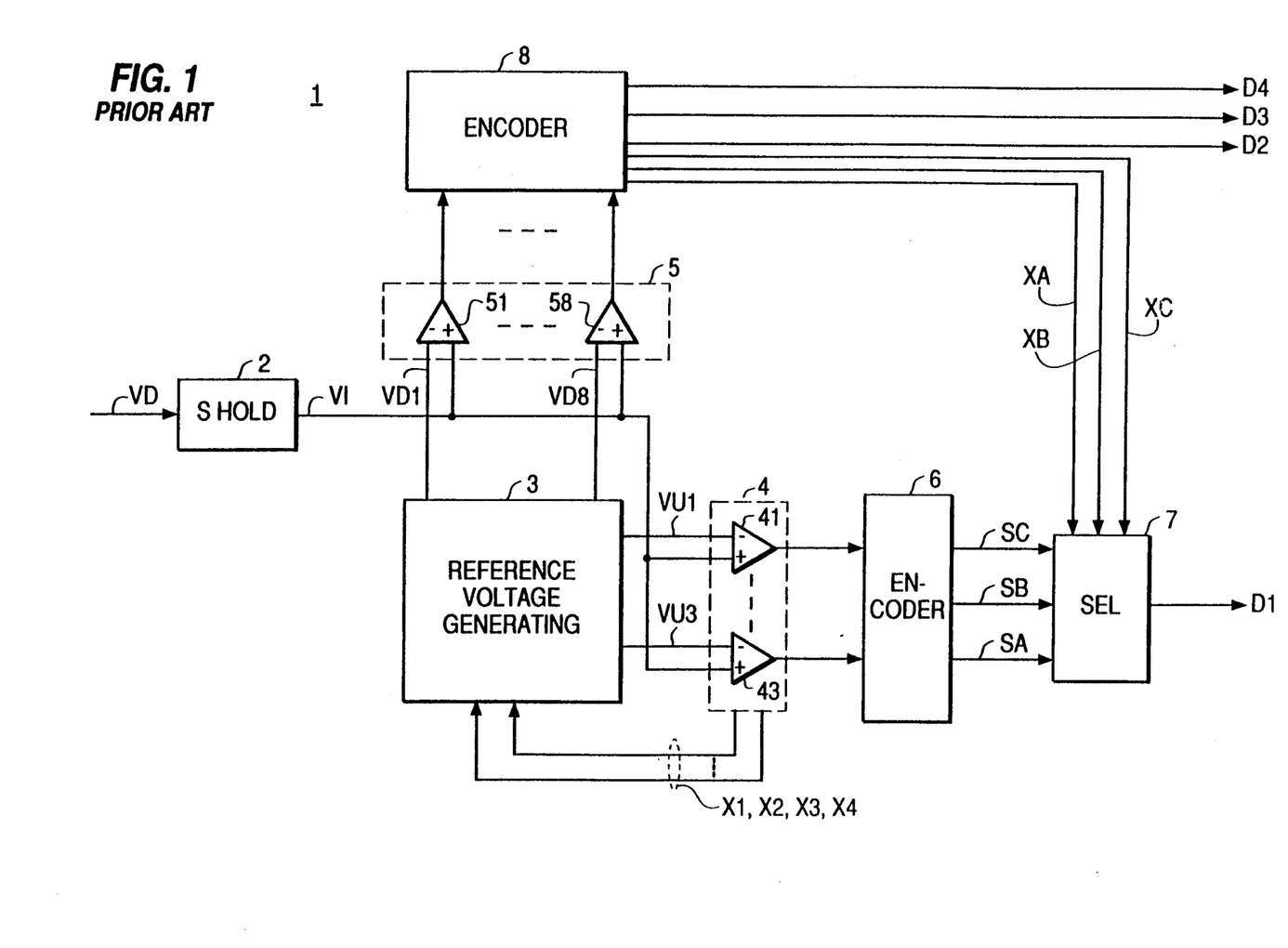
FIG. 1 is a block diagram for explaining a conventional analog/digital conversion circuit.

In FIG. 1, 1 shows the entirety of an A/D conversion circuit which separates a hold voltage VI obtained by sample-holding an input video signal VD into two steps of higher order bits and lower order bits and outputs four bit digital data D1, D2, D3 and D4.

In the A/D conversion circuit 1, a sample hold circuit 2 and reference voltage generating circuit 3 output the hold voltage VI, reference voltages VU1 to VU3 and VD1 to VD8 to a higher order comparing circuit unit 4 and a lower order comparing circuit unit 5.

Figure 2:
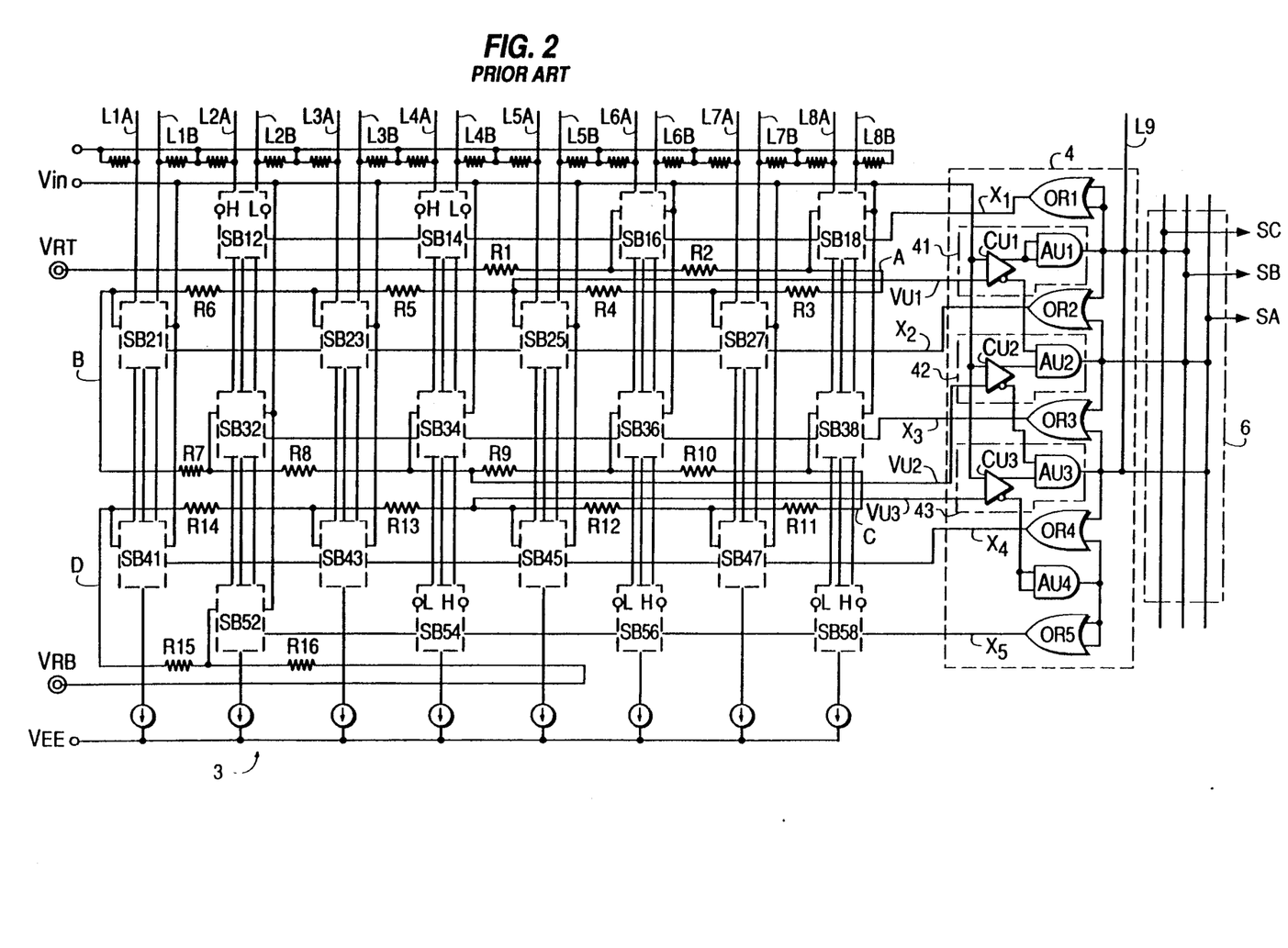
FIG. 2 is a wiring diagram for explaining a conventional reference voltage generating circuit and higher order comparing circuit unit.

The reference voltage generating circuit 3 is constituted by series connected sixteen resistors R1 to R16 between reference voltages VRT and VRB and twenty switching blocks SB12 to SB58 arranged in matrix form of 5 rows × 8 columns as shown in FIG. 2.

The reference voltage generating circuit 3 is adapted to output the reference voltages VU1 to VU3, which are obtained by dividing the difference reference voltage VRT−VRB into four, to the higher order comparing circuit unit 4.

Further the reference voltage generating circuit 3 subdivides the difference reference voltages VRT−VU1 (VU1−VU2, VU2−VU3 and VU3−VRB) selected in the higher order comparing circuit unit 4 while incorporating its redundancy to obtain the reference voltages VD1 to VD8 and as well is adapted to output the hold voltage VI to the lower order comparing circuit unit 5 via lines L1A to L8B and output the reference voltages VD1−VD8 to the lower order comparing circuit unit 5 via lines L1B to L8B.

The higher order comparing circuit unit 4 includes three comparator arrangements 41 to 43, supplies the hold voltage VI to the non-inverted input terminals of respective comparators CU1 to CU3 in the comparator arrangements 41 to 43, and as well supplies the reference voltages VU1 to VU3 to the respective inverted terminals.

The higher order comparing circuit unit 4 compares these reference voltages VU1 to VU3 with the hold voltages VI, converts the comparison result into three sets of line signals SA, SB and SC via an encoder 6 constituted by wired OR circuits, and outputs the same to a selection circuit unit 7.

Herein the encoder 6, for example, outputs logic "0", 1" and "1" as the line signals SA, SB and SC when the output of an AND circuit AU1, and the selection circuit 7 outputs logic "0" or "1" in response to the output result of the selection signals XA, XB and XC.

Further, when the output of either of AND circuits AU2 to AU4 is logic "1" the selection circuit unit 7 outputs logic "0" or "1" in response to the output result of the selection signals XA, XB and XC thereby enabling correction of the detection result in the higher order comparing circuit unit 4.

Further, the higher order comparing circuit unit 4 outputs reference voltage control signals X1 to X4 of the comparator arrangements 41 to 43 to the reference voltage generating circuit 3 and causes the same to output the reference voltages VD1 to VD8 in response to the detection result to the lower order comparing circuit unit 5.

Figure 3:
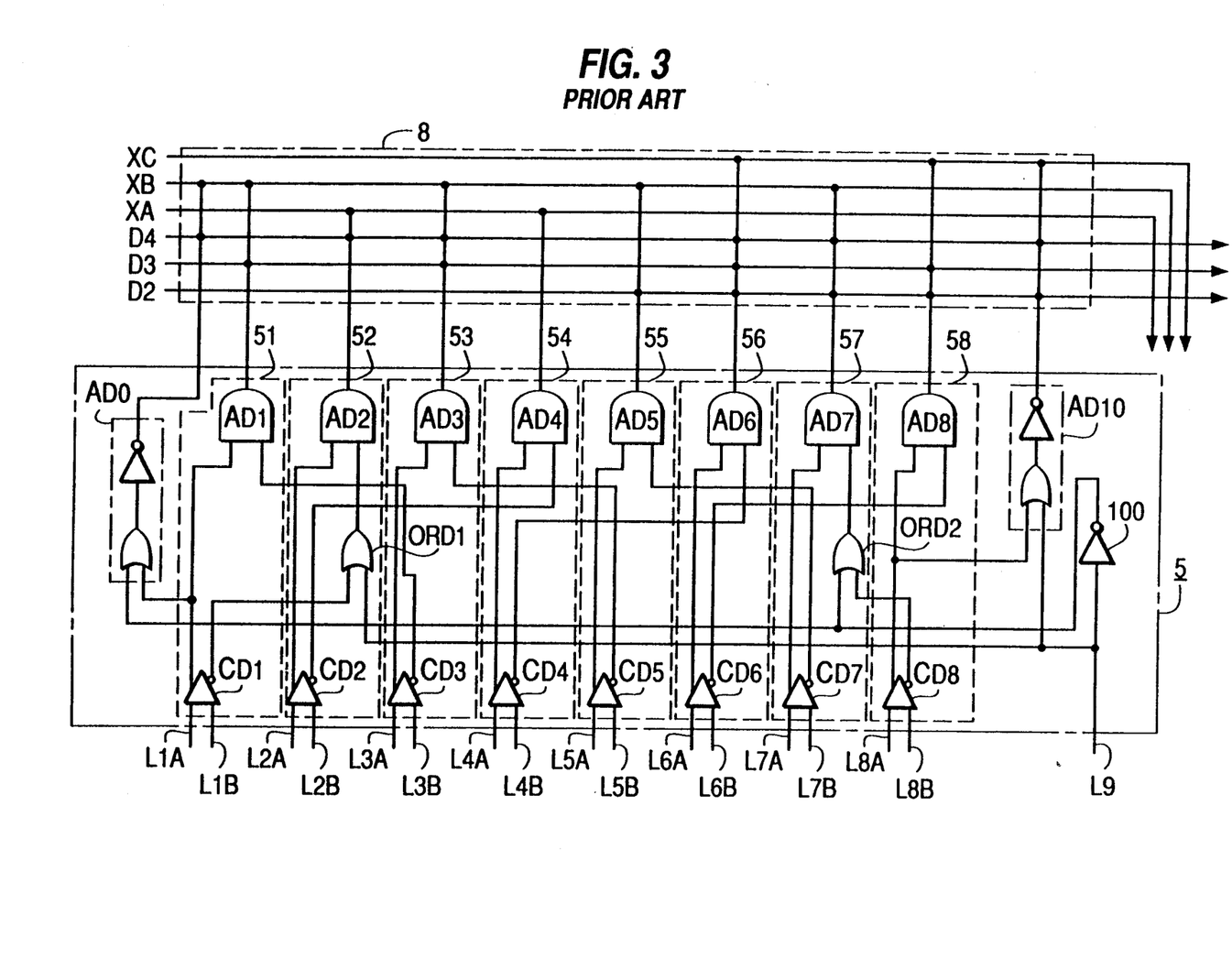
FIG. 3 is a wiring diagram for explaining a conventional lower order comparing circuit unit.
Figure 4:
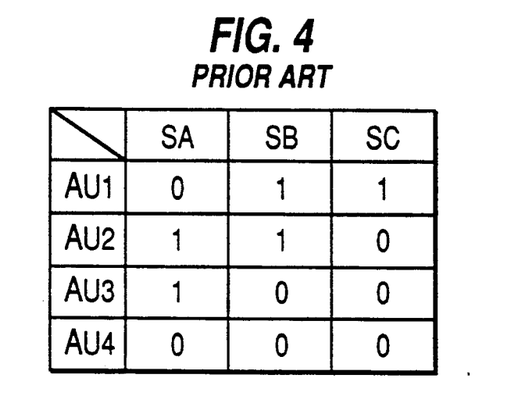
FIG. 4 is a data table for explaining the line output of a higher order encoder.

The lower order comparing circuit unit 5 as shown in FIG. 3 includes eight comparator arrangements 51 to 58, supplies the hold voltage VI to the non-inverted input terminals of the respective comparators CD1 to CD8 in the comparator arrangements 51 to 58, and as well is adapted to supply the lower order bit comparing reference voltages VD1 to VD8 to the inverted input terminals.

The lower order comparing circuit unit 5 compares the reference voltages VD1 to VD8 with the hold voltage VI and outputs the result of the comparison, and the encoder 8 converts the comparison result into code data and outputs the least significant bit D2 in higher order converted data and lower bits D3 and D4 in lower order converted data and as well outputs selection signals XA, XB and XC to the selection circuit unit 7.

Figure 5:
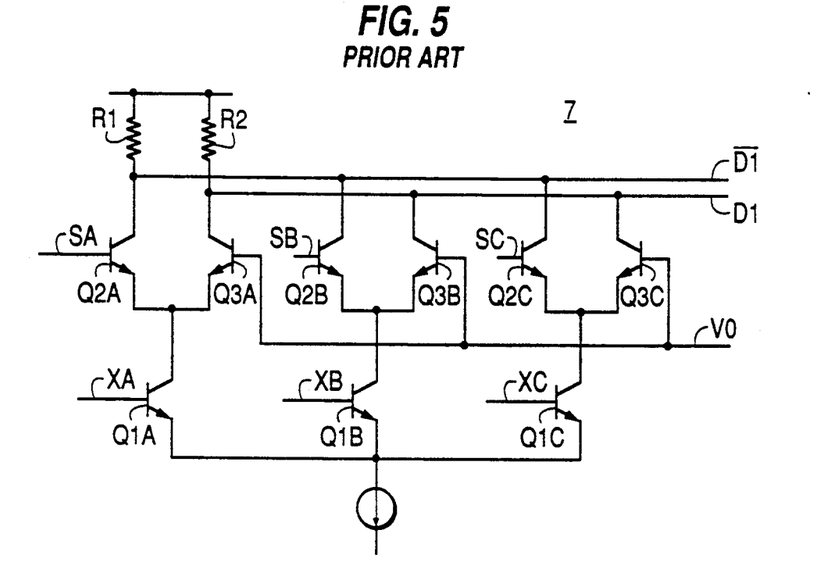
FIG. 5 is a wiring diagram for explaining the constitution of a selection circuit unit.

The selection circuit unit 7 as shown in FIG. 5 is composed of an AND - OR circuit formed by transistors wherein three outputs from three sets of AND circuits having two input terminals are output via a three input OR circuit thereby when either of the selection signals XA, XB and XC is an "H" level signal (being a higher potential) one of the line signals SA, SB and SC is selected and is output as the most significant bit D1.

Namely, in the selection circuit unit 7, the AND circuits are formed by sets of transistors (Q1A and/or Q2A, Q3A), (Q1B and/or Q2B, Q3B) and (Q1C and/or Q2C, Q3C), the inverted output of the most significant bit D1 is obtained via a resistor R1 and as well the non-inverted output of the most significant bit D1 is obtained via a resistor R2.

Thereby, the selection circuit unit 7 operates to correct the code data of the most significant bit D1 when the video signal VD is in the vicinity of the quantization level of two higher order bits, for instance, the video signal VD is near the level of the higher order bit comparing reference voltages VU1, VU2 and VU3.

Figure 6:
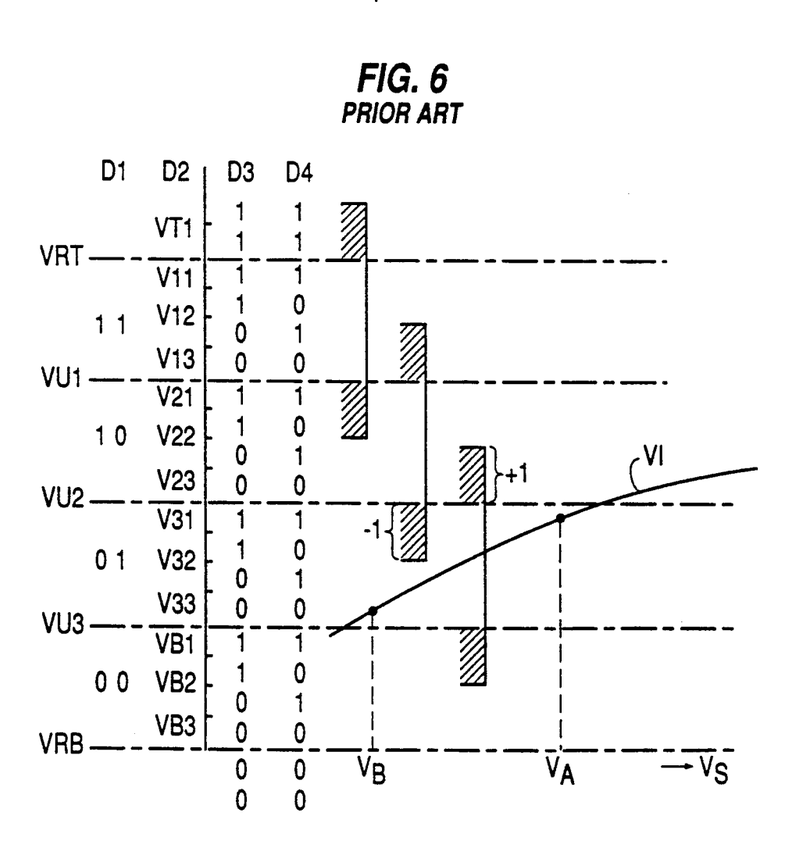
FIG. 6 is an explanatory view showing a relationship between quantized level and conversion code.

As shown in FIG. 6, a video signal is detected by the higher order comparing circuit unit 4 as a value of the second difference potential VU1−VU2 from the highest order, due to the overshooting of the sample hold circuit 2 and a logic "1" is output as the value of the most significant bit D1 at the time when the true converted value of the video signal VD into digital data D1, D2, D3 and D4 is "0111". If the value "111" is obtained as the second bit D2 and lower order bits D3 and D4 from the lower redundant bits, the selection circuit unit 7 outputs the output of the higher order conversion code data SC, in that logic "1" for the significant bit D1, out of the higher order conversion code data SA, SB and SC because only the selection signal XC is in "H" level. As a result, the output is corrected to "0111".

However, more than two signals of the selection signals XA, XB and XC can be rendered at an "H" level because of output error from the lower order comparing circuit unit 5, and an incorrect higher order bit D1 is possibly selected such that there arised a problem that a small error in the lower order comparing circuit unit 5 causes a large error in a higher order bit.

For instance in connection with the above occurrence when both outputs of the signals XA and XC are incidentally rendered to an "H" level, the selection circuit unit 7 outputs the line signal SA or SC, in that outputs logic "1" as the most significant bit D1 as a result "1111" is output as the digital data after A/D conversion. Therefore there arises a possibility that the correction based upon the lower order bits likely causes a large error.

SUMMARY OF THE INVENTION

In view of the foregoing, an object of this invention is to provide an analog/digital conversion circuit which is capable of eliminating a large error in higher order bits even if an output error is caused from lower order bits.

For overcoming such problems, the analog/digital conversion circuit according to the present invention, which outputs an input signal VI after converting the same into digital data D1, D2, D3 and D4, comprises a high order bit comparing unit 4, 6 which compares the input signal VI with respective reference voltages VU1 to VU3 which are fed from the reference voltage generating circuit 3 and outputs a plurality of selection and conversion codes SA, SB and SC corresponding to a predetermined bit based upon the comparison result; a lower order bit comparing unit 5, 8 which compares the input signal VI with respective reference voltages VD1 to VD8 which are provided based upon the comparison result in the higher order bit comparing unit 4, 6 and outputs lower order conversion codes D2 to D4 and a plurality of selection signals XA, XB and XC; selection signal weighting means 11 which weights the selection signals XA, XB and XC and assigns priority thereto; and a selection circuit unit 7 which outputs a selection conversion code SA (SB and SC) corresponding to a selection signal XAO having a higher order priority as a higher order conversion code D1 and outputs the selection and conversion code SA (SB and SC) corresponding to the selection signal XAO (XBO and XCO) having higher order priority as the higher order conversion code D1 when the selection signals (XA, XB and XC), (XA and XB), (XA and XC) and (XB and XC) which permit a plurality of selections for the predetermined bit is output from the lower order bit comparing unit 5 and 8.

By outputting the higher order conversion codes SA, SB and SC corresponding to the selection signals XAO, XBO and XCO assigned with priority as the higher order code data D1 and after weighting the selection signals XA, XB and XC outputted from the lower order bit comparing unit 5 and 8 via the selection signal weighting means 11, a more reliable selection and conversion code SA (SB and SC), corresponding to a selection signal XAO (XBO and XCO) having a higher order priority, is outputted as the higher order conversion code D1. The conversion code D1 corresponds to the predetermined bit even when the selection signals (XA, XB and XC), (XA and XB), (XA and XC) and (XB and XC) permit a plurality of selections corresponding to the predetermined bit outputted from the lower order bit comparing unit 5 and 8 because of an erroneous operation of the low order bit comparing unit 5 and 8. Thereby an analog/digital conversion circuit having a further higher accuracy, more simple configuration and higher processing speed than conventional ones is obtained.

The nature, principle and utility of the invention will become more apparent from the following detailed description when read in conjunction with the accompanying drawings in which like parts are designated by like reference numerals or characters.

DETAILED DESCRIPTION OF THE INVENTION

Figure 7:
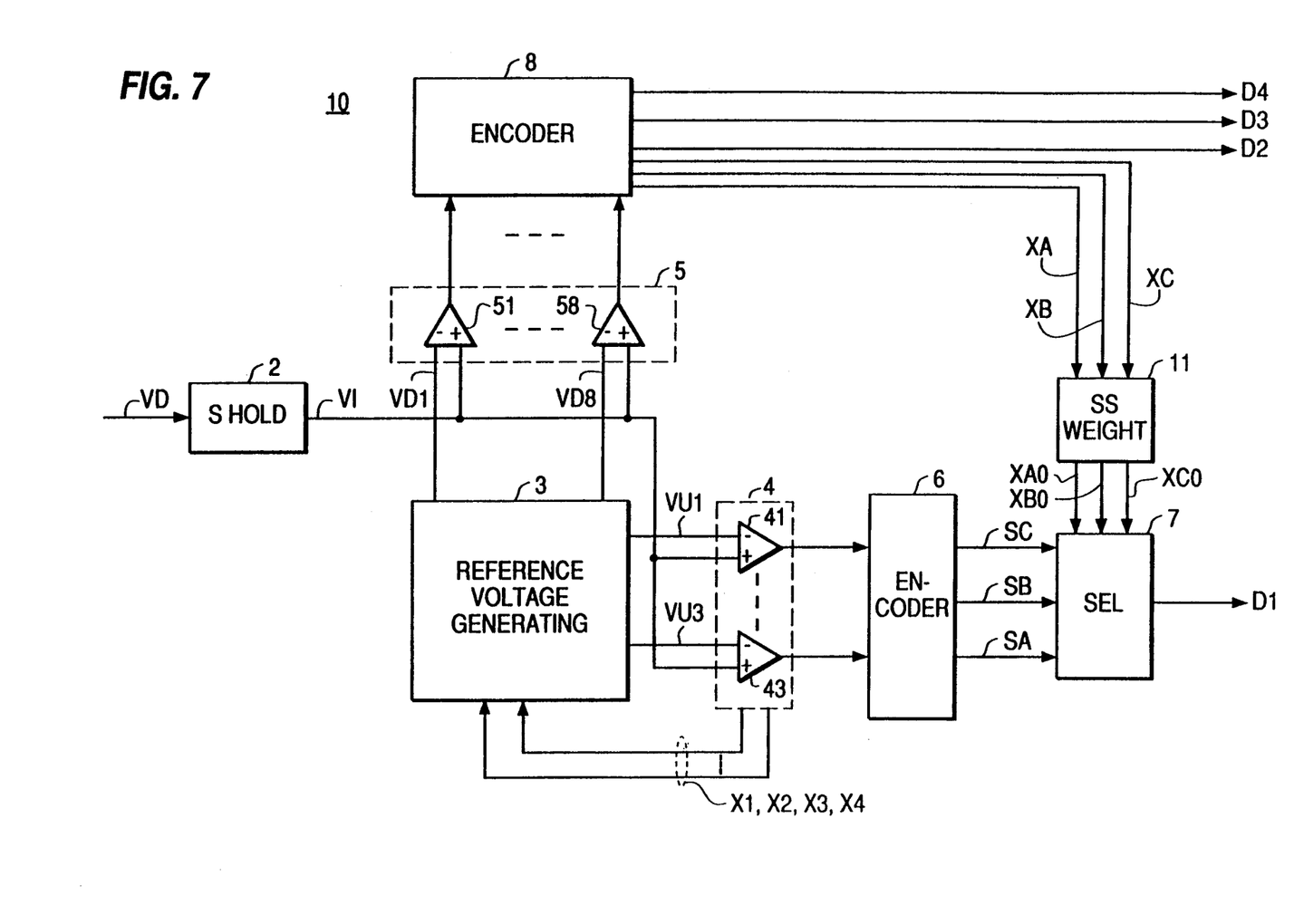
FIG. 7 is a block diagram showing one embodiment of an analog/digital conversion circuit according to the present invention.

Preferred embodiments of this invention will be described with reference to the accompanying drawings:

In FIG. 7 wherein the corresponding portions to those in FIG. 1 are assigned the same reference numerals, 10 shows the entirety of an analog/digital conversion circuit which comprises the same constitution as that shown in FIG. 1 except that selection signals XA, XB and XC outputted from an encoder 8 are fed to a selection circuit unit 7 via a selection signal weighting circuit 11.

Figure 8:
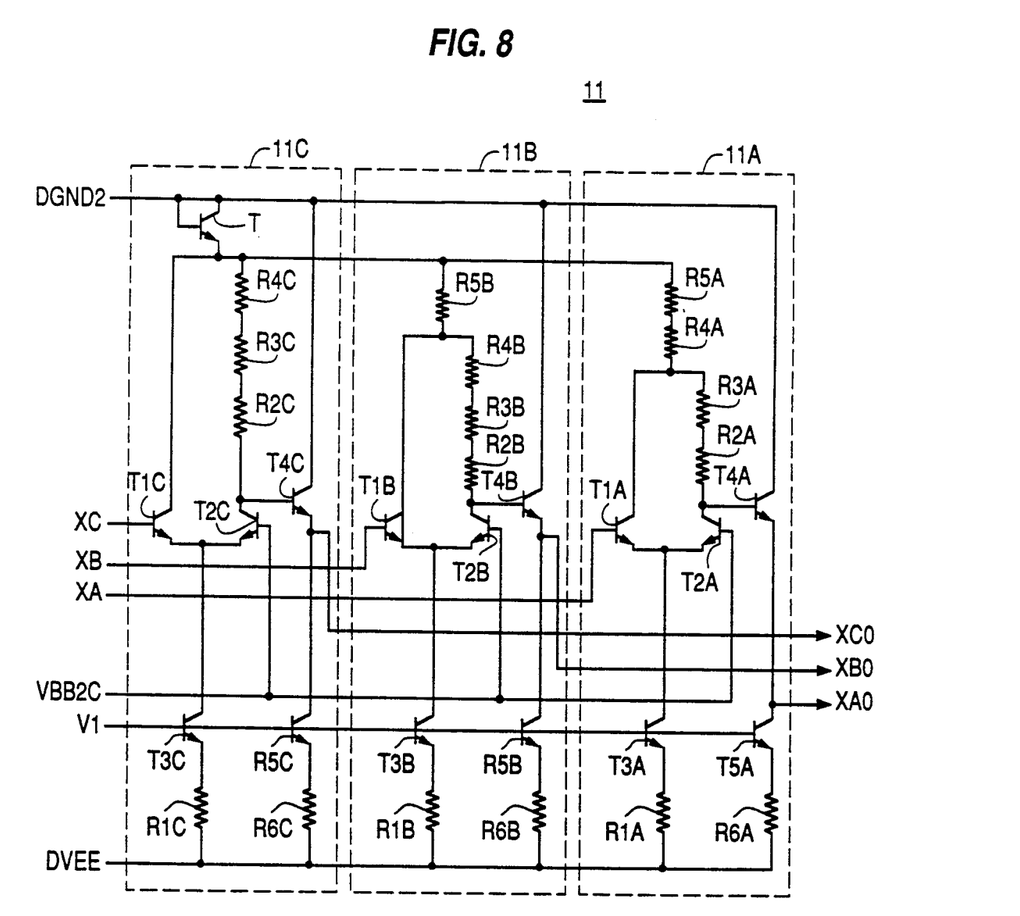
FIG. 8 is a wiring diagram showing one embodiment of a selection signal weighting circuit according to the present invention.

The selection signal weighting circuit 11 as shown in FIG. 8 includes correction circuits 11A, 11B and 11C which output the selection signals XA, XB and XC inputted after varying their amplitudes and reference levels.

The correction circuit 11A constitutes a differential amplifier wherein the terminals of transistors T1A and T2A are connected to a series connection of a transistor T3A for constant-current source and a resistor R1A.

Further, the collector of the transistor T2A is connected to resistors R2A and R3A which set a logic amplitude at 400 (mV) and through the resistors R2A and R3A the collector of the transistor T2A is connected to the collector of the transistor T1A.

Still further, since the collectors of the transistors T1A and T2A are provided with a reference voltage DGND2 (0 (mV)) via resistors R4A and R5A and a transistor T in this order, an "H" level is shifted to minus side by 400 (mV) with respect to the reference voltage DGND2 (0 (mV)).

The collector of the transistor T2A is connected to a transistor T4A. At the emitter terminal of the transistor T4A, to which a transistor T5A and a resistor T6A are connected, a weighted selection signal XAO is formed by weighting the selection signal XA.

As a result, the correction circuit 11A outputs a weighted selected signal XAO of −400 (mV) when the selection signal XA is in potential "H" level and outputs a weighted selection signal XAO of −800 (mV) when the selection signal XA is in potential "L" level.

Likewise, the collector of a transistor T2B in the correction circuit 11B is connected to resistors R2B, R3B and R4B which set a logic amplitude at 600 (mV) and as well is provided with the reference voltage DGND2 (0 (mV)) via a resistor R5B and the transistor T in this order. Thereby potential "H" level is shifted toward the minus side by 200 (mV) with respect to the reference voltage DGND2 (0 (mV)).

As a result, correction circuit 11B outputs a weighted selection signal XBO of −200 (mV) when the selection signal XB is in potential "H" level and outputs a weighted selection signal XBO of −800 (mV) when the selection signal XB is in potential "L" level.

Still, further, the collector of a transistor T2C in the correction circuit 11C is connected to resistors R2C, R3C and R4C which set a logic amplitude at 600 (mV) and as well is provided with the reference voltage DGND2 (0 (mV)).

As a result, the correction circuit 11C outputs a weighted selection signal XCO of 0 (mV) when the selection signal XC is in potential "H" level and further outputs a weighted selection signal XCO of −600 (mV) when the selection signal is in potential "L" level.

Figure 9:
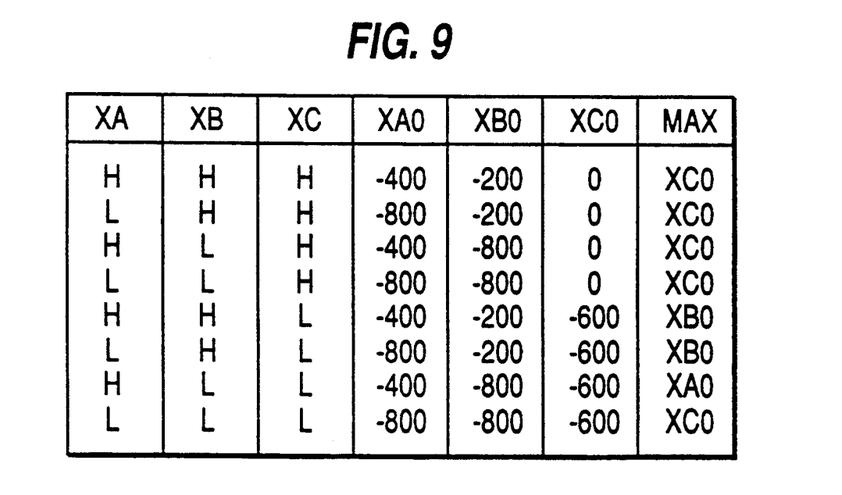
FIG. 9 is a data table for explaining the operation of the selection signal weighting circuit according to the embodiment.
Figure 10:
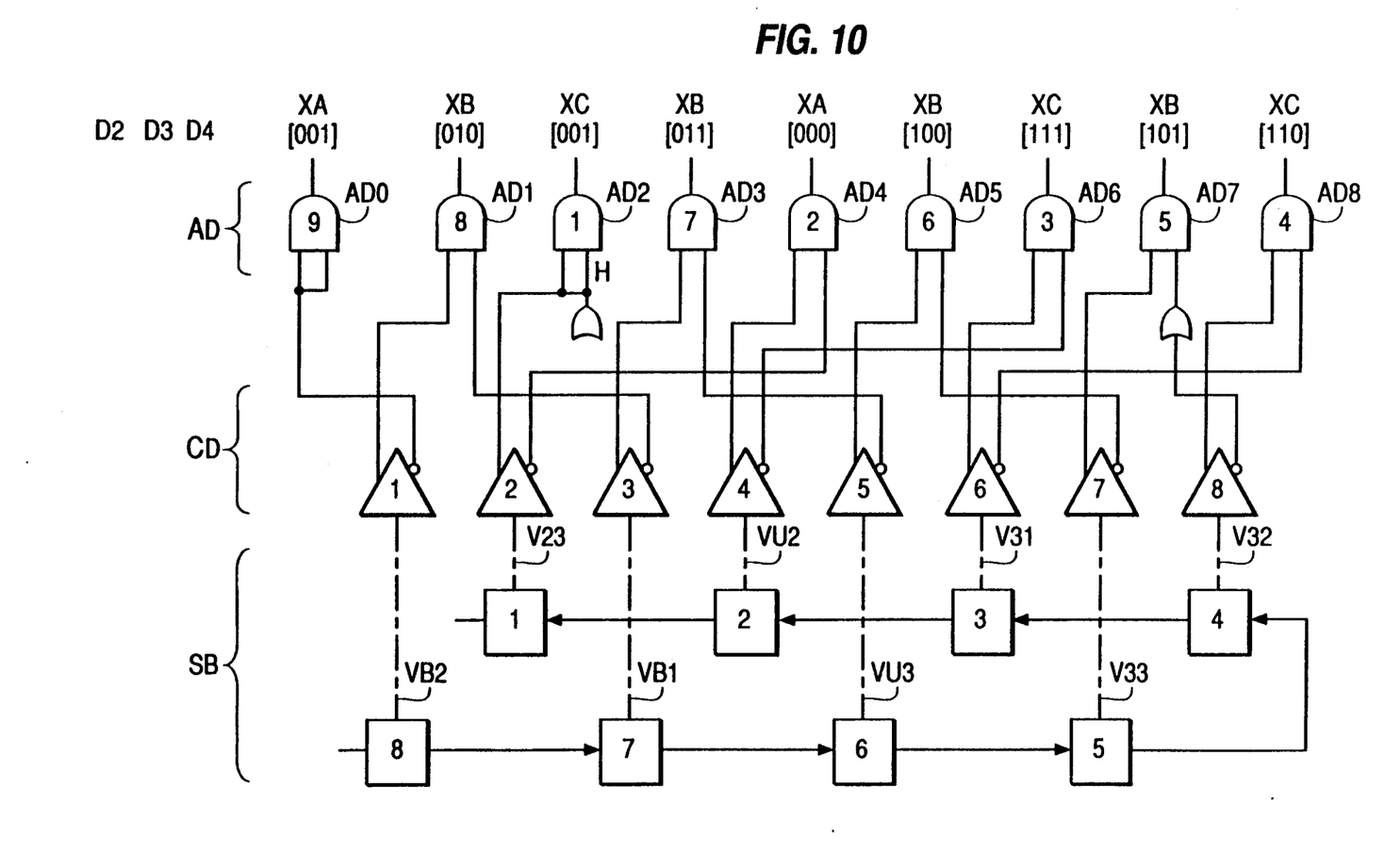
FIG. 10 is an explanatory view for explaining the operation of a lower order comparing circuit unit according to the present invention.

The selection signal weighting circuit 11 as shown in FIG. 9 weights the selection signals XC, XB and XA by assigning priority to the selection signals XC, XB and XA in this order and outputs the selection signals with priority XCO, XBO and XAO in such a manner that one of the selection signals XCO, XBO and XAO always has maximum value, even when a plurality of the selection signals XA, SB and SC rise up to potential "H" level.

Further, the selection signal weighting circuit 11 is constituted so that the selection signal XCO assumes a maximum value when all of the selection signals XA, XB and SC are rendered to potential "L" level.

In the above explained constitution of the A/D conversion circuit 10, when the hold voltage VI is inputted to the higher order comparing circuit unit 4, the hold voltage VI is fed to the non-inverted terminals of first to third comparator arrangements 41 to 43 and as well the reference voltages VU1 to VU3 are fed to their inverted terminals.

When the potential of the hold voltage VI is detected at the third reference voltage band VU2-VU3, only the output of a comparator CU3 among comparators CU1, CU2 and CU3 in the comparator circuits 41, 42 and 43 is rendered "1" and a code data "001" is sequentially outputted from AND circuits AU1 to AU3 to the encoder 6 (see FIG. 2).

At this moment, logic "1", "0" and "0" are outputted from the encoder 6 to the selection signal weighting circuit 11 as line signals SA, SB and SC.

Further at this moment, only the outputs of OR circuits OR3 and OR4 among OR circuits OR1 to OR5 in the higher order comparing circuit unit 4 are rendered "1" and switching blocks SB32, SB34, SB36, SB38, SB41, SB43, SB45 and SB47 on the third and fourth rows in the reference voltage generating circuit 3 are selected by reference voltage control signals X3 and X4.

As a result, comparators CD1 to CD8 of the comparator arrangements 51 to 58 in the lower order comparing circuit unit 5 are respectively provided with lower order bit reference voltages V31 to V33 formed by equally dividing the reference potential between VU2 and VU3 into four and redundant bit reference voltages V23 and V22 and VB1 and VB2 which respectively provide redundant bits of two bits at its upper and lower sides (see FIG. 6).

The comparators CD1 to CD8 compare the reference voltages V22 to VB2 one by one with the hold voltage VI of which signal level is stabilized. When the hold voltage VI is detected, for example, at between the reference voltages VU3 and V23, in that V31<V­1<VU2, only the output of the AND circuit AD6 is rendered "1" and the outputs of the other AND circuits AD0 to AD5 and AD7 are rendered "0".

At this moment, the A/D converter 10 outputs "111" via the encoder 8 as the second bit D2, third bit D3 and fourth bit D4 and as well outputs "LLH" as the outputs of the selection signals XA, XB and XC to the selection signal weighting circuit 11.

The selection signal weighting circuit 11 weights the selection signals XA, XB and XC respectively by −800 (mV), −800 (mV) and 0 (mV) in this order and feeds to the selection circuit unit 7 weighted selection signals XAO, XBO and XCO in which the voltage of the weighted selection signals XCO is maximized like the selection signal XC which is the maximum voltage signal at input stage.

As a result, in the selection circuit unit 7, a transistor to which the weighted selection signal XCO having the highest voltage level is inputted is turned on and the code data of the line signals SC is selected.

Thus "0" is outputted as the most significant bit D1, and the code data of "0111" is outputted from the A/D conversion circuit 10.

As will be seen from the above, when only one of the outputs of the selection signals XA, XB and XC rises up to an "H", in that, when "LHL" or "HLL", the same line signal as in the conventional one is selected.

Contrary, when an error occurred in the output of the lower order comparing circuit 5 and a plurality of the AND circuits AD0 through AD8 are rendered "1", for example when only the output of the AND circuit 6 should be rendered "1", the output of the AND circuit 4 is erroneously rendered "1" and the encoder 8 outputs "111" as the second bit D2, third bit D3 and fourth bit D4 and also outputs "HLH" as the selection signals XA, XB and XC.

In this instance, the selection signal weighting circuit 11 weights these selection signals XA, XB and XC by −400 (mV), −800 (mV) and 0 (mV) in this order, assigns priority to the weighted selection signal XCO over the weighted selection signal XAO, maximizes the voltage level thereof and outputs the same to the selection circuit unit 7 (see FIG. 8).

At this instance, in the selection circuit unit 7, a transistor to which the selection signal XCO weighted by the voltage level is inputted is turned on, the code data of the line signal SC is selected, the output "0" of the line signal SC is outputted as the most significant bit D1 and the data code "0111" is outputted from the A/D conversion circuit 10.

Now, in the conventional A/D conversion circuit 1, the selection signals XA, XB and XC having voltage levels "HLH" are directly inputted to the selection circuit unit 7 such that the output of the most significant bit D1 is determined based upon the code data of the line signal SA or the code data of the line signal SC, in that, rendered to "1" and the code data "1111" is outputted from the A/D conversion circuit 1. As a result, the error in the low order bit causes a large error in the higher order bit.

As will be seen from the above, in the present embodiment, even when a plurality of the outputs of these selection signals XA, XB and XC are rendered to an "H", in that, in the case of "HHH", "LHH", "HLH" or "HHL", the error that occurred in the comparison output in lower order bit is prevented from affecting the higher order bit.

Further, when an error occurs in the output of the lower order comparing circuit 5 and none of the AND circuits AD0 to AD8 are rendered "1", for example, in the case that the output of the AND circuit 6 should be rendered "1" the output of the AND circuit AD6 is erroneously rendered "0", the encoder 8 outputs "000" as the second bit D2, third bit D3 and fourth bit D4 and also outputs "LLL" as the selection signals XA, XB and XC.

At this instance, the selection signal weighting circuit 11 weights the selection signals XA, XB and XC, respectively by −800 (mV), −800 (mV) and −600 (mV) although in this order, assigns priority to the weighted selection signal XCO over the other weighted selection signals XAO and XBO, maximizes the voltage level of the weighted selection signal XCO, outputs the same to the selection circuit unit 7 (see FIG. 9), and selects the code data of the line signal SC which corresponds to the weighted selection signal XCO having the highest voltage level.

In the above constitution, even when a plurality of the selection signals XA, XB and XC are rendered "H" and an output error in the lower order bits is caused due to malfunctioning in the output of the lower order comparing circuit unit 5, since the line signals SA, SB and SC are selected as the first bit D1 by providing a priority to the selection signals XA, XB and XC, occurrence of a large error in the high order bit is effectively prevented even if a malfunction in a signal output of the lower order bits is caused.

Further, the A/D conversion circuit having the above explained constitution is particularly suitable for an A/D conversion circuit which requires a high speed processing with such a simple structure that the code data of the first bit D1 is selected from the line signals SA, SB and SC which are weighted in the encoder 6 based upon the lower order bits D2, D3 and D4.

Still further, although in the above embodiment, an example wherein the video signal VD is converted into the digital data of four bits is explained, the present invention is not limited thereto and is applicable to conversions into digital data of more than four bits.

Still further, although in the above embodiment, the conversion of the video signal VD into the digital data is explained, the present invention is not limited thereto and is applicable to conversions of any analog signals to digital data.

Still further, although in the above embodiment, the selection signal weighting circuit 11 is constituted as shown in FIG. 8 in which an "H" level of the selection signal XA is set at −400 (mV) and an "L" level thereof at −800 (mV), an "H" level of the selection signal XB is set at −200 (mV) and an "L" level thereof at −800 (mV) and an "H" level of the selection signal XC is set at 0 (mV) and an "L" level thereof at −600 (mV), the present invention is not limited thereto and may weight the selection signals with other circuit configurations other than the above specific circuit configuration.

Still further, although in the above embodiment, an example wherein a higher priority is assigned to the selection signal XC is explained, the present invention is not limited thereto and is permitted to assign a higher priority to the other selection signals XA and XB.

Still further, although in the above embodiment, an example wherein the highest bit D1 is selected based upon the second bit through the fourth bit is explained, the present invention is not limited thereto and is permitted to select a plurality of higher order bits based upon the selection signals of a plurality of lower order bits.

Still further, although in the above embodiment, an example wherein the present invention is applied to the two step series parallel type analog/digital conversion circuit is explained, the present invention is not limited thereto and is broadly applicable to other types of analog/digital conversion circuits.

As explained above, according to the present invention, the selection signals which are outputted based upon the conversion codes of the lower order bits are assigned priority via weighting thereof. When selection signals having the same level are outputted a conversion code corresponding to a selection signal having a higher priority is outputted as for a higher order bit so that even when an error in the lower order bit comparing circuit unit is caused, the higher order bit is prevented from being affected therefrom. Thereby an analog/digital conversion circuit of a further higher accuracy is obtained with a simple constitution.

While there has been described in connection with the preferred embodiments of the invention, it will be obvious to those skilled in the art that various changes and modifications may be made therein without departing from the invention, and it is aimed, therefore, to cover in the appended claims all such changes and modifications that fall within the true spirit and scope of the invention.

What is claimed is:

1. An analog/digital conversion circuit for converting an input analog signal into a digital signal having upper and lower bits divided by a plurality of steps of figures, comprising:
   an upper bit comparator for comparing said input analog signal with first reference voltages obtained by dividing a reference voltage into first unit voltages so as to output first conversion data corresponding to a plurality of upper bits;
   selective data generation means for generating a plurality of sets of selective conversion data corresponding to said first conversion data inputted;
   upper bit data outputting means for outputting selective conversion data designated by a selection signal from said plurality of sets of selective conversion data as upper bit output data corresponding to a plurality of upper figures of said input analog signal;
   a lower bit comparator for comparing said input analog signal with second sets of reference voltages obtained by dividing a reference voltage region within which said input analog signal is out of said first set of reference voltages and third sets of reference voltages adjacent to said reference voltage region so as to output a second conversion data corresponding to a plurality of lower bits and redundancy bits;

lower bit data outputting means for outputting said second conversation data as a lower bit output corresponding to a plurality of lower figures of said input analog signal;

selection signal generating means for generating a plurality of selection signals which select one of said sets of selective conversion data to be outputted as said upper bit output data on the basis of said second conversion data; and selection signal weighting means for supplying one of said selection signals to said upper bit data outputting means as a weighted selection signal, wherein said plurality of selection signals are weighted with a predetermined priority order and one of said selection signals is selectively outputted according to said priority order if the plurality of selection signals are outputted at the same time from said selection signal generating means.

2. The analog/digital conversion circuit according to claim 1, wherein said input analog signal is a video signal.

3. The analog/digital conversion circuit according to claim 1, wherein said upper bit data outputting means outputs the most significant bit data as said upper bit output data.

4. The analog/digital conversion circuit according to claim 1, wherein said analog/digital conversion circuit is a two step series parallel type.

* * * * *